United States Patent
Koh et al.

(10) Patent No.: US 11,599,021 B2
(45) Date of Patent: Mar. 7, 2023

(54) PHOTORESIST COMPOSITIONS AND METHODS FOR FABRICATING SEMICONDUCTOR DEVICES USING THE SAME

(71) Applicants: Samsung Electronics Co., Ltd., Suwon-si (KR); Inpria Corporation, Corvallis, OR (US)

(72) Inventors: Chawon Koh, Yongin-si (KR); Tsunehiro Nishi, Seongnam-si (KR); Brian Cardineau, Corvallis, OR (US); Sangyoon Woo, Leuven (BE); Jason Stowers, Corvallis, OR (US); Soo Young Choi, Hwaseong-si (KR)

(73) Assignees: Samsung Electronics Co., Ltd., Suwon-si (KR); Inpria Corporation, Corvallis, OR (US)

(*) Notice: Subject to any disclaimer, the term of this patent is extended or adjusted under 35 U.S.C. 154(b) by 0 days.

(21) Appl. No.: 17/736,132

(22) Filed: May 4, 2022

(65) Prior Publication Data
US 2022/0260906 A1 Aug. 18, 2022

Related U.S. Application Data

(62) Division of application No. 16/399,473, filed on Apr. 30, 2019, now Pat. No. 11,327,398.

(51) Int. Cl.
| | |
|---|---|
| *G03F 7/004* | (2006.01) |
| *G03F 7/11* | (2006.01) |
| *H01L 21/027* | (2006.01) |
| *H01L 21/311* | (2006.01) |
| *G03F 7/20* | (2006.01) |
| *G03F 7/32* | (2006.01) |

(52) U.S. Cl.
CPC ............. *G03F 7/0042* (2013.01); *G03F 7/11* (2013.01); *G03F 7/2004* (2013.01); *H01L 21/0274* (2013.01); *H01L 21/31144* (2013.01); *G03F 7/325* (2013.01)

(58) Field of Classification Search
CPC . G03F 7/11; G03F 7/26; G03F 7/0042; C08F 220/22
See application file for complete search history.

(56) References Cited

U.S. PATENT DOCUMENTS

| | | | |
|---|---|---|---|
| 5,684,079 | A | 11/1997 | Yumoto et al. |
| 6,844,134 | B2 | 1/2005 | Choi et al. |
| 7,589,141 | B2 | 9/2009 | Zalich et al. |
| 7,687,221 | B2 | 3/2010 | Hirosaki et al. |
| 8,017,303 | B2 | 9/2011 | Goldfarb et al. |

(Continued)

FOREIGN PATENT DOCUMENTS

| | | |
|---|---|---|
| JP | 4883286 B2 | 2/2012 |
| JP | 6040774 B2 | 12/2016 |

OTHER PUBLICATIONS

Wang, et al., ""Novel Embedded Barrier Layer Materials for ArF Non-topcoat Immersion Applications" Proceedings of SPIE, 7140, Lithography Asia (2008)".

*Primary Examiner* — Amanda C. Walke
(74) *Attorney, Agent, or Firm* — Myers Bigel, P.A.

(57) ABSTRACT

Provided herein are photoresist compositions and methods for fabricating semiconductor devices using the same. A photoresist composition may include an organometallic material, a fluorine-containing material, and an organic solvent.

8 Claims, 4 Drawing Sheets

(56) References Cited

U.S. PATENT DOCUMENTS

| | | |
|---|---|---|
| 8,366,967 B2 | 2/2013 | Keszler et al. |
| 8,415,000 B2 | 4/2013 | Stowers et al. |
| 8,710,497 B2 | 4/2014 | Kim et al. |
| 8,999,621 B2 | 4/2015 | Enomoto et al. |
| 9,176,377 B2 | 11/2015 | Stowers et al. |
| 9,223,214 B2 | 12/2015 | Cho et al. |
| 9,274,423 B2 | 3/2016 | Kim et al. |
| 9,281,207 B2 | 3/2016 | Stowers et al. |
| 9,310,684 B2 | 4/2016 | Meyers et al. |
| 9,543,147 B2 * | 1/2017 | Liu ............... C08F 220/18 |
| 9,637,657 B2 | 5/2017 | May et al. |
| 9,644,056 B2 | 5/2017 | Masuyama et al. |
| 9,823,564 B2 | 11/2017 | Stowers et al. |
| 9,864,275 B2 * | 1/2018 | Chang ............. G03F 7/168 |
| 10,503,070 B2 | 12/2019 | Zi et al. |
| 10,678,132 B2 | 6/2020 | Kanda |
| 11,029,602 B2 | 6/2021 | Zi et al. |
| 11,037,786 B2 | 6/2021 | De Silva et al. |
| 11,098,070 B2 | 8/2021 | Cardineau et al. |
| 2008/0032202 A1 | 2/2008 | Ishizuka et al. |
| 2010/0267898 A1 | 10/2010 | Saito et al. |
| 2013/0177848 A1 | 7/2013 | Kanto et al. |
| 2014/0287359 A1 | 9/2014 | Mori et al. |
| 2016/0116839 A1 | 4/2016 | Meyers et al. |
| 2016/0194520 A1 | 7/2016 | Wilczek |
| 2017/0102612 A1 | 4/2017 | Meyers et al. |
| 2018/0371134 A1 | 12/2018 | Avataneo et al. |
| 2019/0241782 A1 | 8/2019 | Zook et al. |
| 2019/0258160 A1 | 8/2019 | Satoh et al. |

\* cited by examiner

PHOTORESIST COMPOSITIONS AND METHODS FOR FABRICATING SEMICONDUCTOR DEVICES USING THE SAME

CROSS-REFERENCE TO RELATED APPLICATION

This application is a divisional of U.S. application Ser. No. 16/399,473, filed Apr. 30, 2019, the disclosure of which is incorporated herein by reference in its entirety.

FIELD

The disclosure herein relates to photoresist compositions and methods for fabricating semiconductor devices using the same.

BACKGROUND

Semiconductor devices have been highly integrated. Thus, finer and more precise patterning is needed in preparing semiconductor devices. Accordingly, an exposure process using extreme ultraviolet (EUV) having a wavelength of 13.4 nm as a light source has been utilized. The EUV is absorbed entirely in a conventional photoresist film due to a very short wavelength thereof, which makes forming a precise pattern difficult. Therefore, in a photolithography process using EUV as a light source, a new photoresist material capable of transmitting the EUV may be useful to allow for precise and fine patterning.

SUMMARY

The present disclosure provides a photoresist composition capable of providing a precise pattern.

The present disclosure also provides a method for fabricating a semiconductor device that is capable of forming a precise pattern.

An embodiment of the inventive concepts provides a photoresist composition including: an organometallic material; a fluorine-containing material; and an organic solvent.

In an embodiment of the inventive concepts, a method for fabricating a semiconductor device includes: providing a photoresist composition including an organometallic material, a fluorine-containing material, and an organic solvent; forming a photoresist film by coating a substrate with the photoresist composition, wherein the photoresist film includes a photosensitive film and a moisture barrier layer positioned on the photosensitive film, wherein the photosensitive film comprises the organometallic material and the moisture barrier layer comprises the fluorine-containing material; evaporating the organic solvent through a soft bake process; converting a portion of the photosensitive film into a mask pattern through an exposure process and a post bake process; and removing the photosensitive film and leaving the mask pattern through a development process.

In an embodiment, a method for fabricating a semiconductor device includes: forming a photosensitive film and a moisture barrier layer sequentially stacked on a substrate; converting a portion of the photosensitive film into a mask pattern through an exposure process and a post bake process; and removing the photosensitive film and leaving the mask pattern through a development process.

BRIEF DESCRIPTION OF THE FIGURES

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

DETAILED DESCRIPTION

Hereinafter, exemplary embodiments of the inventive concepts will be described in detail with reference to the accompanying drawings.

As used herein, "and/or" refers to and encompasses any and all possible combinations of one or more of the associated listed items, as well as the lack of combinations when interpreted in the alternative ("or").

Figure 1:
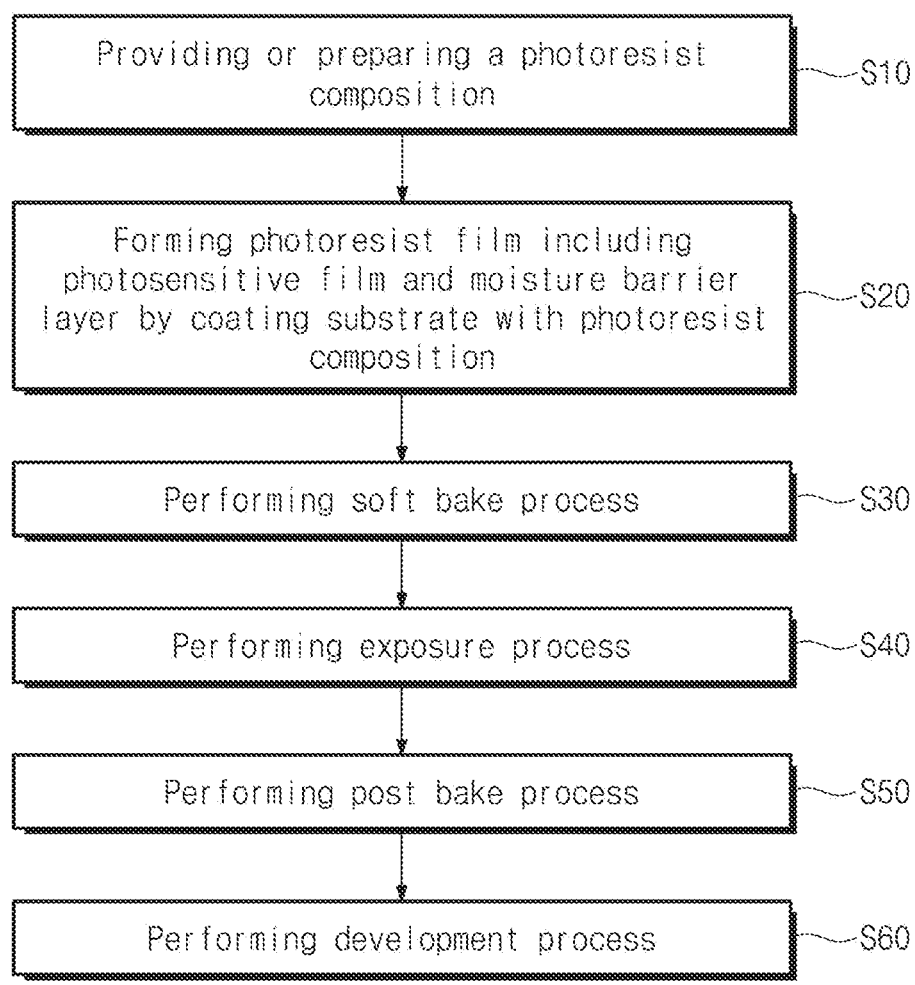
FIG. 1 is a flowchart showing a method for fabricating a semiconductor device according to an example embodiment of the inventive concepts.

FIG. 1 is a flowchart showing a method for fabricating a semiconductor device according to an example embodiment of the inventive concepts. FIGS. 2A to 2F are cross-sectional views sequentially illustrating processes of a method for fabricating a semiconductor device according to an example embodiment of the inventive concepts.

Figure 2A:
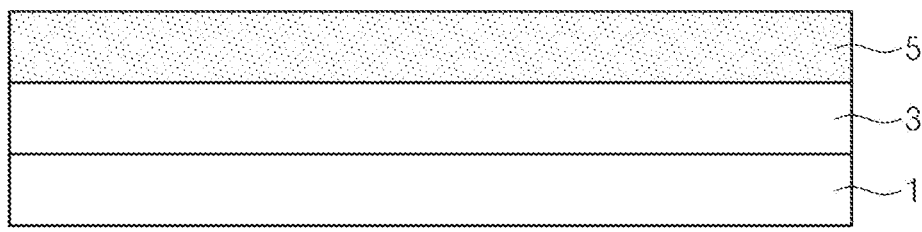
FIGS. 2A to 2F are cross-sectional views sequentially illustrating processes of a method for fabricating a semiconductor device according to an example embodiment of the inventive concepts.

Referring to FIGS. 1 and 2A, a substrate 1 is prepared. The substrate 1 may be, for example, a silicon single crystal wafer or a silicon on insulator (SOI) substrate. An etching target film 3 may be formed on the substrate 1. The etching target film 3 may be, for example, an insulation film; a polysilicon film such as a silicon oxide film, a silicon oxynitride film or a silicon nitride film; or a conductive film such as a metal-containing film.

Subsequently, a photoresist composition is prepared or provided (S10). The photoresist composition includes a fluorine-containing material, an organometallic material, and an organic solvent. In the photoresist composition, the organometallic material may be present in an amount of 0.1-99 wt. % of the photoresist composition. In some embodiments, the organometallic material may be present in the photoresist composition in an amount of 0.1%, 1%, 5%, 10%, 15%, 20%, 25%, 30%, 35%, 40%, 45%, or 50% to 55%, 60%, 65%, 70%, 75%, 80%, 85%, 90%, 95%, or 99% by weight of the photoresist composition. The fluorine-containing material may be present in an amount of 0.1-30 wt. % of the photoresist composition. In some embodiments, the fluorine-containing material may be present in the photoresist composition in an amount of 0.1%, 1%, 5%, 10%, or 15% to 20%, 25%, or 30% by weight of the photoresist composition. The organic solvent may be present in an amount of 0.9-99.8 wt. % of the composition. In some embodiments, the organic solvent may be present in the photoresist composition in an amount of 1%, 5%, 10%, 15%, 20%, 25%, 30%, 35%, 40%, 45%, or 50% to 55%, 60%, 65%, 70%, 75%, 80%, 85%, 90%, 95%, or 99% by weight of the photoresist composition. The photoresist composition may be used for a photolithography process using an EUV light source.

The fluorine-containing material may include at least one functional group selected from: —CFOH, —CHCFOH, —CHCFCFOH, —C(CF)OH, —CFCF(CF)OH, and/or —CHC(CF)OH.

The fluorine-containing material may be a fluorine-containing polymer material. The fluorine-containing polymer material may have a structure represented by one of formula (1) to (14) below.
(1)
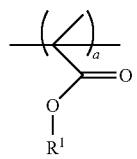
(2)
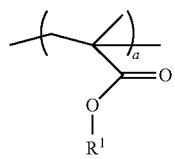
(3)
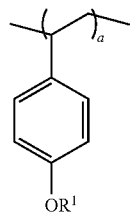
(4)
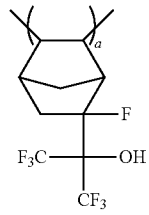
(5)
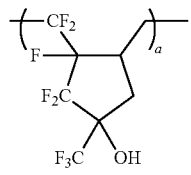
(6)
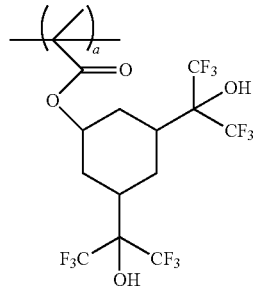
(7)
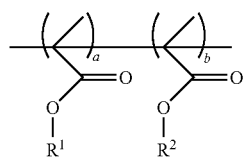
(8)
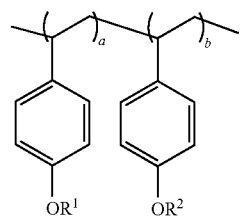
(9)
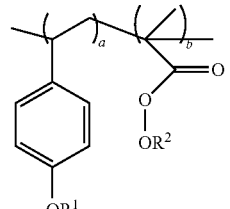
(10)
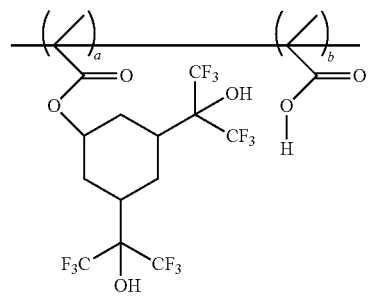
(11)
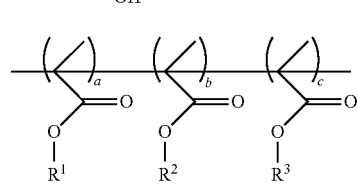
(12)
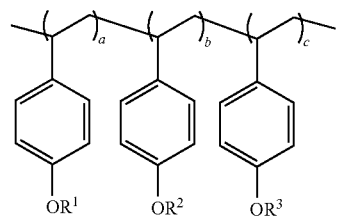
(13)
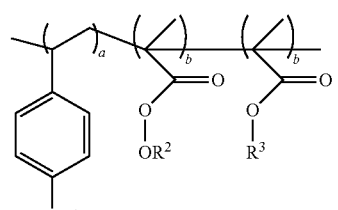
(14)
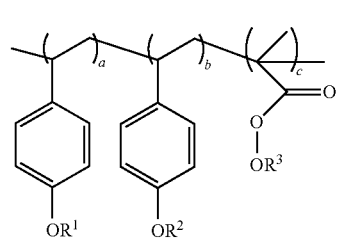

In formulae (1) to (14), a, b and c, when present, may each independently be a natural number such as, for example, a natural number from 1 to 100 or 1 to 50.

In formulae (1) to (14), $R^1$, if present, may each be fluorine. In formulae (7) to (9) and (11) to (14), $R^2$, if present, may each independently be a hydrogen or a hydrophilic group (e.g., a polar group). The hydrophilic group may comprise a carboxyl group, a hydroxyl group and/or an amine. The hydrophilic group may be able to absorb moisture through hydrogen bonding with water. In formulae (11) to (14), $R^3$, if present, may each independently be a hydrophobic group or a non-polar group. The non-polar group may allow for the moisture barrier layer 5b to be dissolved well in a developer during a development process. $R^3$ in formulae (11) to (14) may comprise at least one metal such as, e.g., tin (Sn), indium (In) and/or hafnium (Hf). When $R^3$ includes a metal, EUV absorptivity of the photosensitive film 5a may be increased, optionally compared to absorptivity of a photosensitive film not in accordance with the present inventive concepts, thereby improving sensitivity of the photosensitive film 5a.

In formulae (7) to (10), a/(a+b) may be 0.1-1 and b/(a+b) may be 0.0-0.9. In formulae (11) to (14), a/(a+b+c) may be 0.0-0.9, b/(a+b+c) may be 0.1-1, and c/(a+b+c) may be 0.0-0.9.

In some embodiments, the fluorine-containing polymer material may include: an acrylate; a methacrylate such as, e.g., shown in formula (1); and/or a methyl methacrylate (e.g., as shown in formula (2)) as a monomer or a polymer backbone. In some embodiments, the fluorine-containing polymer material may include polyhydroxy acrylate (PHS) as a monomer as shown, e.g., in formula (3). The fluorine-containing polymer material may include a cyclic fluoroalcohol material as a monomer as shown, e.g., in formulae (4) and/or (5). In some embodiments, the fluorine-containing polymer material may include a methacrylate, to which a cyclic fluoroalcohol is bonded, as a monomer as shown, e.g., in formula (6). In some embodiments, the fluorine-containing polymer material may include combinations of two or more monomers having a structure selected from formulae (1) to (6) as shown, e.g., in formulae (7) to (12).

The organometallic material may be an organometallic nano-cluster material. The organometallic material may include at least one of tin (Sn), indium (In), antimony (Sb) and hafnium (Hf). In some embodiments, the organometallic material may have a chemical formula selected from formulae (15) to (17) below.

$$R_w MeO_{(2-(w-2)-(x/2))}(OH)_x \quad (15)$$

$$R_y MeL_{4-y} \quad (16)$$

$$RMeO_{(3/2-z/2)}(OH)_z \quad (17)$$

In formulae (15) to (17), R may be a hydrocarbon compound having 1 to 30 carbon atoms and containing at least one atom selected from carbon, nitrogen and oxygen. In formulae (15) to (17), Me may be at least one of tin (Sn), indium (In), antimony (Sb) and hafnium (Hf). In formula (15), 0<w≤2 and 0<(w+x)≤4. In formula (16), y may be 1 or 2, and L may be a metal ligand. In formula (17), 0<z<3.

The organic solvent may be at least one of methyl isobutyl carbinol (MIBC), ether, propylene glycol monomethylether acetate (PGMEA), propylene glycol monomethylether (PGME), ethyl lactate (EL), and β-hydroxy β-methylbutyric acid (HBM).

The photoresist composition may further include a surfactant. When the organometallic material is present in the photoresist composition in a high amount, coating failure may occur in the coating step (S20) of FIG. 1 for the photoresist composition. In this case, a surfactant may improve coating performance of the photoresist composition. Example surfactants include, but are not limited to, commercially available surfactants such as, e.g., sulfinol series of Airproduct Co. or F-series (F-410, F-444, F-477, R-08, R-30, etc.) of DIC (Dainippon Ink and Chemicals, Incorporated). A surfactant may be present in the photoresist composition in an amount of 0-3 wt. % with respect to the total weight of the photoresist composition. In some embodiments, the surfactant may be included in an amount of 0.2-0.8 wt. % of the photoresist composition. When the amount of the surfactant is more than 3 wt. % of the photoresist composition, it may increase a possibility that the film quality of the photoresist film becomes poor.

In some embodiments, the photoresist composition may include a moisture absorbent in an amount of 0-10 wt. % of the photoresist composition. The moisture absorbent may contain an amine or a super absorbent polymer. Example moisture absorbents include, but are not limited to, polyoxyethylene nonylphenolether, $R^5C_6H_4C(CH_2CH_2O)_nH$, polyethylene glycol (PEG), $HO(CH_2CH_2O)_nH$ and/or polyacrylamide, wherein $R^5$ may be a hydrocarbon compound having 1 to 30 carbon atoms and containing at least one atom selected from carbon, nitrogen and oxygen and n is a natural number from 1 to 1000. The moisture absorbent may capture moisture, in some embodiments an excessive amount of moisture, in the air permeated into the photoresist film (reference numeral 5 in FIGS. 2A and 2B), so that the moisture absorbent may suppress or prevent a reaction between moisture and the organometallic material in the photosensitive film (reference numeral 5a in FIG. 2B).

According to some embodiments, preparing a photoresist composition may include mixing a fluorine-containing material, an organometallic material and an organic solvent. Preparing the photoresist composition may further include adding a surfactant, water and/or a moisture absorbent. In some embodiments, at least one of a surfactant, water and moisture absorbent are added to the photoresist composition.

Figure 2B:
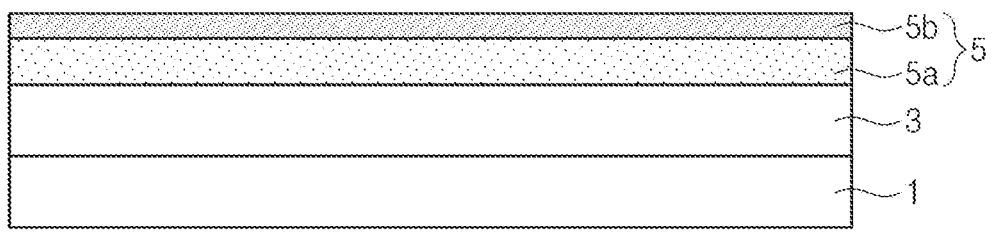

Referring to FIGS. 1, 2A and 2B, a photoresist film 5 including a photosensitive film 5a and a moisture barrier layer 5b may be formed by coating a substrate 1 with the photoresist composition (S20). Specifically, a photoresist film 5 may be formed by coating the etching target film 3 above the substrate 1 with the photoresist composition. The photoresist film 5 may be formed to have a thickness of 1.5 nm-55 nm. The fluorine-containing material contained in the photoresist composition has a low surface energy due to the fluorine-containing monomer and, accordingly, the fluorine-containing material may move to an upper portion in the photoresist film 5 after coating. Accordingly, the moisture barrier layer 5b comprising the fluorine-containing material may be formed. The moisture barrier layer 5b may also be referred to as a fluorine-containing self-assembled moisture barrier layer.

The organometallic material contained in the photoresist composition may be positioned under the moisture barrier layer 5b, and may constitute the photosensitive film 5a. The photosensitive film may have a thickness of 1 nm-30 nm. The moisture barrier layer 5b may have a thickness of 0.5 nm-25 nm.

Referring to FIGS. 1 and 2B, a soft bake process is performed (S30), whereby the organic solvent, which may be present in the photoresist film 5 may be evaporated. Accordingly, the photoresist film 5, which includes the photosensitive film 5a and the moisture barrier film 5b, may become close to a solid state.

Figure 2C:
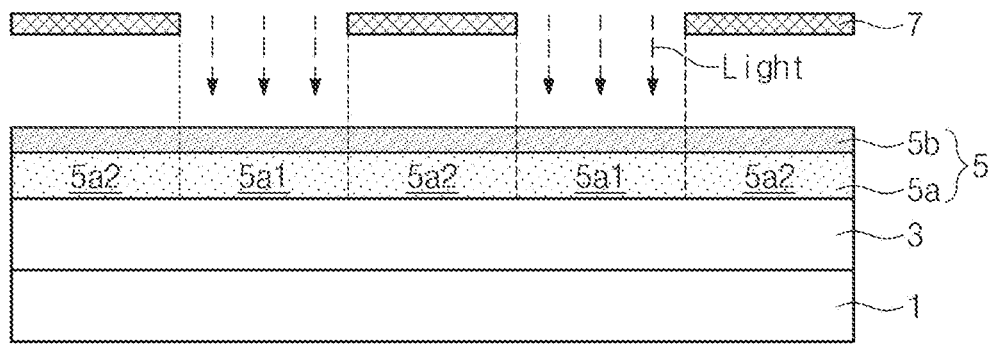

Referring to FIGS. 1 and 2C, an exposure process is performed (S40). The exposure process may be performed using an EUV light source and a photomask 7. In the exposure process, light (for example, EUV) that has been passed through the photomask 7 may be transmitted through the moisture barrier layer 5b, and may be incident into the photosensitive film 5a, whereby the photosensitive film 5a may have an exposed portion Sal and a non-exposed portion 5a2. A bond between a metal and at least one ligand of the organometallic material may be broken due to the incident light at the exposed portion Sal of the photosensitive film 5a, thereby forming a dangling bond. Accordingly, the organometallic material may comprise dangling bonds. This phenomenon does not occur in the non-exposed portion 5a2 of the photosensitive film 5a. When the fluorine-containing material constituting the moisture barrier layer 5b contains a metal (e.g., when the fluorine-containing material has a structure represented by one of formula (11) to (14) and $R^3$ in formula (11) to (14) contains a metal), electrons may be emitted from the metal (e.g., the metal contained in $R^3$) by the incident light in the exposure process. The emitted electrons may move to the exposed portion 5a1 of the photosensitive film 5a to increase EUV absorptivity, thereby improving the sensitivity of the photosensitive film 5a.

Figure 2D:
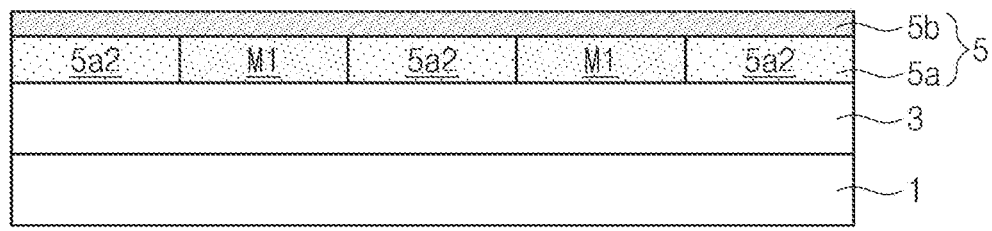

Subsequently, referring to FIGS. 1 and 2D, a post bake process may be performed (S50). In the post bake process, a hydroxyl group (—OH) present in the photoresist film 5 (e.g., from water) may be combined with the dangling bonds by heat to combine the organometallic materials, thereby providing a crosslinking reaction. Alternatively or in addition, at this time, the organometallic materials having the dangling bonds may be combined with each other, thereby providing a crosslinking reaction. Thus, the exposed portion 5a1 of the photosensitive film 5a may be converted into a mask pattern M1.

Figure 2E:
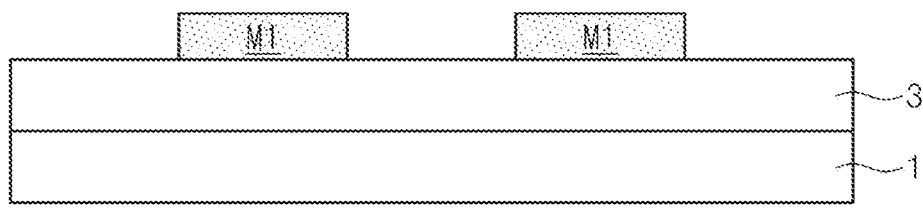

Referring to FIGS. 1 and 2E, a development process is performed (S60), whereby the non-exposed portion 5a2 of the photosensitive film 5a may be removed. At this time, the moisture barrier layer 5b may also be simultaneously removed. A developer used in the development process may be n-butyl acetate and/or 2-heptanone. The fluorine-containing material present in the moisture barrier layer 5b may dissolve well in the developer because of a non-polar group in the fluorine-containing material. Accordingly, only the mask pattern M1 may be left on the etching target film 3.

Figure 2F:
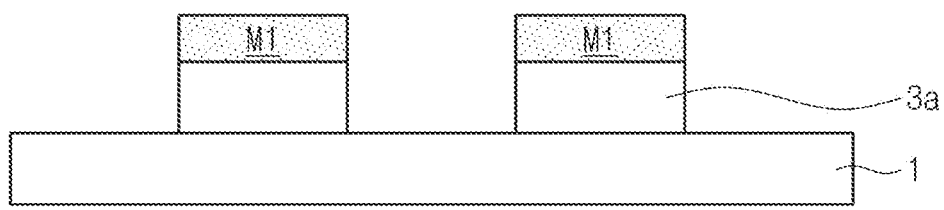

Subsequently, referring to FIG. 2F, a desired pattern 3a may be formed by etching the etching target film 3 using the mask pattern M1 as an etching mask.

The coating step (S20) with the photoresist composition, the soft bake process (S30) and the exposure process (S40) may each be performed under an atmosphere containing moisture in a predetermined amount such as, for example, atmosphere containing moisture in an amount of about 45%.

A method for fabricating a semiconductor device of the present inventive concepts uses a photoresist composition including a fluorine-containing material. Since fluorine contained in the fluorine-containing material exhibits strong hydrophobicity and/or liquid repellency, it may prevent or reduce moisture contained in the air from permeating into the photosensitive film 5a. A hydrophilic group present in the fluorine-containing material may capture moisture (e.g., an excessive amount of moisture) permeated into the photoresist film 5, which may thereby prevent or reduce the organometallic material present in the photosensitive film 5a from reacting with moisture or reduce its reaction with moisture. When the organometallic material reacts with an excessive amount of moisture, a condensation reaction may occur to form a metal oxide, which may not be dissolved in the developer and may make it difficult to form a precise pattern. However, in the present inventive concepts, it may be possible to improve this limitation by using a photoresist composition of the present inventive concepts, and a precise pattern formation may be realized.

Since the photoresist compositions of the present inventive concepts are not a chemically amplified photoresist, image degradation due to diffusion of acid, which is a limitation of a chemically amplified photoresist, does not occur and as such a precise pattern may be formed. Furthermore, the photoresist compositions of the present inventive concepts have excellent etching resistance because of an organometallic material contained in the photoresist composition, so that an etching process may be possible even with a thin thickness. Therefore, in some embodiments, since the photoresist film 5 may be formed having a thin thickness, a precise pattern may be formed by the EUV light source. The photoresist compositions according to embodiments of the present inventive concepts may increase moisture stability because of the fluorine-containing material contained in the photoresist composition.

According to some example embodiments of inventive concepts, a photoresist composition may include an organometallic material so that an etch resistance of a photoresist layer may increase. In some embodiments, the photoresist composition may include a fluorine-containing material so that moisture stability of a photoresist layer may increase. Thus, it is possible to form a precise pattern by EUV light source.

According to some example embodiments of inventive concepts, a method of fabricating a semiconductor device employs the photoresist composition. Thus, it is possible to form a precise pattern.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for fabricating a semiconductor device, the method comprising:
   providing a photoresist composition including an organometallic material, a fluorine-containing material, and an organic solvent;
   forming a photoresist film by coating a substrate with the photoresist composition, wherein the photoresist film includes a photosensitive film and a moisture barrier layer on the photosensitive film, wherein the photosensitive film comprises the organometallic material and the moisture barrier layer comprises the fluorine-containing material;
   evaporating the organic solvent using a soft bake process;
   converting a portion of the photosensitive film into a mask pattern using an exposure process and a post bake process; and
   removing the photosensitive film and leaving the mask pattern using a development process.

2. The method of claim 1, further comprising removing the moisture barrier layer using the development process.

3. The method of claim 1, wherein the development process is performed using n-butyl acetate or 2-heptanone.

4. The method of claim 1, wherein the photosensitive film has a thickness of 1 nm-30 nm, and the moisture barrier layer has a thickness of 0.5 nm-25 nm.

5. A method for fabricating a semiconductor device, the method comprising:
 forming a photosensitive film and a moisture barrier layer on a substrate, wherein the photosensitive film and the moisture barrier layer are sequentially stacked on the substrate;
 converting a portion of the photosensitive film into a mask pattern using an exposure process and a post bake process; and
 removing the photosensitive film and leaving the mask pattern using a development process.

6. The method of claim 5, wherein
 forming the photosensitive film and the moisture barrier layer on the substrate comprises:
 providing a photoresist composition including an organometallic material, a fluorine-containing material, and an organic solvent; and
 forming a photoresist film by coating the substrate with the photoresist composition,
 wherein the photoresist film includes the photosensitive film and the moisture barrier layer, and
 wherein the photosensitive film comprises the organometallic material and the moisture barrier layer comprises the fluorine-containing material.

7. The method of claim 6, further comprising, prior to the exposure process, evaporating the organic solvent from the photoresist film using a soft bake process.

8. The method of claim 5, wherein the moisture barrier layer is removed using the development process.

\* \* \* \* \*